(12) United States Patent
Tanaka et al.

(10) Patent No.: US 7,142,822 B2
(45) Date of Patent: Nov. 28, 2006

(54) PACKAGE DEVICE FOR ACCOMMODATING A RADIO FREQUENCY CIRCUIT

(75) Inventors: Makoto Tanaka, Obu (JP); Kazuoki Matsugatani, Kariya (JP)

(73) Assignee: Denso Corporation, Kariya (JP)

( * ) Notice: Subject to any disclaimer, the term of this patent is extended or adjusted under 35 U.S.C. 154(b) by 670 days.

(21) Appl. No.: 10/459,232

(22) Filed: Jun. 11, 2003

(65) Prior Publication Data
US 2003/0232603 A1 Dec. 18, 2003

(30) Foreign Application Priority Data
Jun. 12, 2002 (JP) ............... 2002-171501

(51) Int. Cl.
*H04B 1/40* (2006.01)
(52) U.S. Cl. .................. 455/74; 455/82; 455/351; 455/73; 340/572.7; 340/572.1; 340/10.1; 257/659; 257/664; 257/787; 210/222
(58) Field of Classification Search .................. 455/74, 455/82, 351; 257/659, 664, 787; 340/572.7, 340/572.1, 10.1
See application file for complete search history.

(56) References Cited

U.S. PATENT DOCUMENTS

| | | | | |
|---|---|---|---|---|
| 5,576,718 A | * | 11/1996 | Buralli et al. ......... 343/700 MS |
| 5,955,752 A | * | 9/1999 | Fukaya et al. ............... 257/275 |
| 6,008,762 A | * | 12/1999 | Nghiem ............... 343/700 MS |
| 6,018,299 A | * | 1/2000 | Eberhardt ................. 340/572.7 |
| 6,107,920 A | * | 8/2000 | Eberhardt et al. ........ 340/572.7 |
| 6,137,693 A | * | 10/2000 | Schwiebert et al. ........ 361/803 |
| 6,229,685 B1 | * | 5/2001 | Bothra et al. ............. 361/306.3 |
| 6,236,101 B1 | * | 5/2001 | Erdeljac et al. ............. 257/531 |
| 6,262,495 B1 | * | 7/2001 | Yablonovitch et al. ..... 307/101 |
| 6,411,261 B1 | * | 6/2002 | Lilly .......................... 343/756 |
| 6,698,084 B1 | * | 3/2004 | Uchikoba .................... 29/601 |

* cited by examiner

*Primary Examiner*—Marceau Milord
(74) *Attorney, Agent, or Firm*—Harness, Dickey & Pierce, PLC

(57) ABSTRACT

A compact package whose inner walls can be located near a radio frequency circuit without changing the characteristics of the radio frequency circuit has a planar circuit on the bottom of the package, which is enclosed with metal walls. A high impedance plate is formed in two dimensions on the metal plate of a lid. The high impedance plate has a dielectric sheet on which is formed a conductor sheet on which is formed a two-dimensional periodic array of right hexagonal metal patches. The high impedance plate blocks surface propagation of electromagnetic waves in a certain frequency band (band gap). The operating frequency of the planar circuit is set within the band gap, so that the lid and the planar circuit can be put close to each other with no change in the operation characteristics of the planar circuit.

18 Claims, 12 Drawing Sheets

| | DESIGN EXAMPLE1 | DESIGN EXAMPLE2 |
|---|---|---|
| RELATIVE PERMITTIVITY $\varepsilon$ OF DIELECTRIC SHEET | 2.6 | 10.5 |
| THICKNESS d OF DIELECTRIC SHEET (mm) | 3.2 | 1.6 |
| DISTANCE $L_1$ BETWEEN METAL PATCHES (mm) | 0.15 | 0.20 |
| THROUGH HOLE PITCH $L_2$ (mm) | 7.00 | 5.20 |
| THROUGH HOLE DIAMETER $\phi$ (mm) | 0.8 | 0.8 |
| RESONANT FREQUENCY $f_0$ (GHz) | 4.7 | 4.8 |
| WAVELENGTH $\lambda$ WITH RESPECT TO $f_0$ (mm) | 63.8 | 62.5 |
| BAND GAP $\Delta f$ (GHz) | 4.3~5.6 | 4.6~5.0 |
| PERIODIC STRUCTURE PITCH $L_2/\lambda$ | 0.11 | 0.08 |

AMPLITUDE CHARACTERISTIC

PHASE CHARACTERISTIC

— HIP LID
--- METAL LID
— NO LID

PACKAGE DEVICE FOR ACCOMMODATING A RADIO FREQUENCY CIRCUIT

CROSS REFERENCE TO RELATED APPLICATION

This application is based upon, claims the benefit of priority of, and incorporates by reference, the contents of Japanese Patent Application No. 2002-171501 filed Jun. 12, 2002.

BACKGROUND OF THE INVENTION

1. Field of the Invention

The present invention relates to a package for accommodating a radio frequency circuit.

2. Description of the Related Art

Miniaturization is among the requirements of a package accommodating a radio frequency circuit. For package miniaturization, various functions (or circuit elements) may be integrated in an identical package. In this case, however, unwanted radiation occurring in the package produces interference between the signals of the respective functions, with the problem of adverse effects on the characteristics of the entire radio frequency circuit.

As a measure against this, Japanese Patent Laid-Open Publication No. 2000-307305 discloses a technology in which a periodic structure consisting of periodically-altered materials is arranged on an inner wall of a package containing a radio frequency circuit. The radiation energy from unwanted radiation sources in the package is thus confined locally to prevent interference with other devices (first conventional technology). The foregoing publication also discloses a second conventional technology in which partitions are arranged in the package with respect to each of the functions of the radio frequency circuit.

Now, in terms of package size, the second conventional technology requires some space between the partitions and the radio frequency circuit in order to avoid interaction between the partitions and the circuit. This means a limit to minimization. Meanwhile, the first conventional technology uses no partition and thus dispenses with the space layout for partitions accordingly.

Nevertheless, the foregoing first conventional technology has not taken account of the miniaturization associated with the distance between the periodic structural inner walls of the package and the radio frequency circuit. More specifically, when the periodic structure is put near the radio frequency circuit which is formed as a planar circuit, it is unknown how the planar circuit itself is characteristically affected.

SUMMARY OF THE INVENTION

In view of the foregoing, it is an object of the present invention to provide a package capable of being made small in which the inner walls of the package can be put near a radio frequency circuit with no change in the characteristic of the radio frequency circuit.

To achieve the foregoing object, according to a first aspect of the invention, a package for accommodating a radio frequency circuit has a photonic band gap material formed in two dimensions on a formation surface with at least part of a surface of a formation wall inside the package as the formation surface. The formation wall is at least part of the walls constituting the package. The photonic band gap material has a band gap for blocking a surface current in a predetermined frequency band. The radio frequency circuit has an operating frequency falling within the frequency band of the band gap.

According to this invention, at least part of the surfaces inside the package accommodating the radio frequency circuit form the formation surface. The photonic band gap material, which passes no surface current in the frequency band corresponding to the operating frequency of the radio frequency circuit, is formed in two dimensions on this formation surface. Since no image current corresponding to the current in the radio frequency circuit flows over the surface of the photonic band gap material, it is possible to provide a package in which the formation surface can be put near the radio frequency circuit without causing variations in the characteristics of the radio frequency circuit, which is accommodated in the closed space inside the package. In other words, it is possible to provide a miniaturized package.

According to a second aspect of the invention, the formation wall may be made of a metal plate. The photonic band gap material is formed on the formation surface of this metal plate. The strength of the formation wall can thus be secured by the metal plate of the formation wall, irrespective of the mechanical characteristic of the photonic band gap material, thereby permitting a package structure.

According to a third aspect of the invention, the photonic band gap material formed on this formation surface may be made of a high impedance plate including a dielectric sheet of predetermined thickness, a conductor sheet formed on the backside of the dielectric sheet, a plurality of identically-shaped metal patches arranged in two dimensions on the surface of the dielectric sheet with their ends at equal intervals from each other, and connecting members for electrically connecting the conductor sheet and the metal plates. The metal patches lying on the surface of the high impedance plate are arranged to face the radio frequency circuit.

According to a fourth aspect of the invention, a surface of the formation wall lying on the outside of the package may be made of the conductor sheet of the high impedance plate. That is, the formation wall may be made of the high impedance plate itself.

According to a fifth aspect of the invention, the formation wall may be made of a metal plate, and the conductor sheet of the high impedance plate may be electrically bonded onto the formation surface of the metal plate. Here, the package structure can be secured by the metal plate. Incidentally, being electrically bonded refers to connecting metal members by means such as soldering.

According to a sixth aspect of the invention, the connecting members may be through holes. This facilitates fabricating the high impedance plate.

According to a seventh aspect of the invention, a plurality of anti-warpage slits may be formed in the conductor sheet of the high impedance plate. This helps to prevent warpage of the high impedance plate itself.

According to an eighth aspect of the invention, the formation surface is perpendicular to an electric-field vector occurring inside the package.

According to this aspect, the radio frequency circuit can be prevented from causing electromagnetic waves in waveguide mode inside the package. It is therefore possible to provide a package which precludes interference between the functions of the radio frequency circuit due to unwanted wave propagation inside the package. In short, it is possible to provide a package having a so-called high isolation capability.

According to a ninth aspect of the invention, the radio frequency circuit may be a planar circuit having a circuit element arranged on a planar ground pattern. The ground pattern is located parallel with the formation surface.

According to a tenth aspect of the invention, a detachable lid is formed in part of the walls constituting the package. Here, the lid serves as the formation wall, and a surface of the lid facing the radio frequency circuit serves as the formation surface. According to this aspect, the photonic band gap material is formed in two dimensions on the inside of the lid of the package, i.e., the surface facing the radio frequency circuit. It is therefore possible to provide a package in which the lid can be opened and closed to create and adjust the radio frequency circuit without causing characteristic variations.

According to an eleventh aspect of the invention, in either type of packages where the lid in a wall constituting the package serves as a formation wall and where the lid does not serve as a formation wall, part of the package other than the lid may serve as the formation wall. Then, the gap between the formation wall and the radio frequency circuit can be reduced without causing variations in circuit characteristics.

According to a twelfth aspect of the invention, a partition for sectioning the internal space of the package may be used as the formation wall. Consequently, the radio frequency circuit can be segmented by the partition for mutual shielding, with a reduced gap between the partition and the radio frequency circuit.

According to a thirteenth aspect of the invention, this partition may be made of a metal plate. With both sides of the metal plate as the formation surface, photonic band gap material or a high impedance plate is formed on the formation surface.

According to a fourteenth aspect of the invention, a connector for electric connection is formed on the surface of the formation wall opposite from the formation surface. The connector and the radio frequency circuit are connected with a signal line. According to this aspect, the gap between the formation wall and the radio frequency circuit can be made smaller to reduce the length of the signal line for signal outlet from the radio frequency circuit to the connector. This allows signal outlet with a smaller transmission loss.

According to a fifteenth aspect of the invention, the radio frequency circuit includes a plurality of blocks for operating at a plurality of frequencies, respectively. A plurality of photonic band gap materials having band gaps covering the corresponding operating frequencies are formed on the formation surface as opposed to the blocks, respectively.

According to this aspect, even if the radio frequency circuit has blocks that operate at different frequencies, the image currents in any of the frequency bands can be blocked by the photonic band gap materials having the respective corresponding band gaps. It is therefore possible to prevent such signal propagation as in a waveguide from occurring inside the package.

According to a sixteenth aspect of the invention, when the formation surface includes a part that is opposed to a transmission line part of the radio frequency circuit including the circuit element and a non-opposed part other than the opposed part, the non-opposed part is provided with a photonic band gap material configured to have a band gap whose frequency band covers an unwanted frequency component that is different from the operating frequency of the radio frequency circuit. According to this aspect, even if the radio frequency circuit causes spurious, or unwanted frequency components other than its operating frequency, the photonic band gap material having the band gap corresponding to the spurious unwanted frequency components, formed on the non-opposed part not opposed to the transmission line of the radio frequency circuit, can suppress spurious propagation inside the package.

According to a seventeenth aspect of the invention, the package comprises another radio frequency circuit arranged on the surface of the formation wall opposite from the formation surface. The radio frequency circuit accommodated in the package and the other radio frequency circuit are connected with a signal line through the formation wall.

According to this aspect, if another radio frequency circuit is arranged on the surface of the formation wall opposite from the formation surface, or outside the package, it is connected with the radio frequency circuit in the package with a signal line through the formation wall. The gap between the formation wall and the radio frequency circuit inside the package can thus be reduced to shorten the signal line for low-loss transmission.

According to an eighteenth aspect of the invention, the package comprises an element antenna arranged on the surface of the formation wall opposite from the formation surface. The radio frequency circuit accommodated in the package and the element antenna are connected with a signal line through the formation wall.

Even in this aspect, the gap between the formation wall and the radio frequency circuit inside the package can be reduced as described above. It is therefore possible to shorten the signal line extending between the element antenna and the radio frequency circuit through the formation wall. This allows low-loss transmission, and facilitates matching between the element antenna and the radio frequency circuit.

According to a nineteenth aspect of the invention, the surface of the formation wall opposite from the formation surface may be made of a metal plate. The element antenna may be either a monopole antenna or a patch antenna. In this case, the metal plate functions as the antenna ground plane of the monopole antenna or patch antenna.

According to a twentieth aspect of the invention, the formation surface may be formed on both sides of the formation wall. The element antenna may be a patch antenna or an inverted L antenna having a resonant frequency falling within a band gap of photonic band gap material formed on the formation surfaces. Consequently, the photonic band gap material formed on the formation surface of the formation wall on the element-antenna side precludes image currents, thereby allowing the formation of a low profile antenna such as an inverted L antenna. Since no surface current flows over the ground plane, it is possible to form a high gain antenna with suppressed backside antenna radiation.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figures 1, 3:
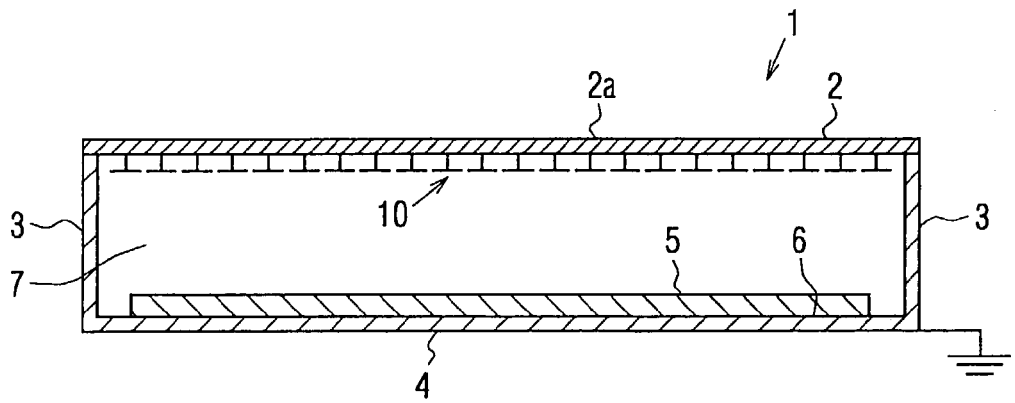
FIG. 1 is a cross-sectional view of a package according to a first embodiment of the present invention.
FIG. 3 is a chart showing part dimensions and electric characteristics of two types of HIPs for use in the package of the first embodiment.

Hereinafter, embodiments of the present invention will be described with reference to the drawings. In the following embodiments, common identical components will be designated by the same reference numerals and description thereof will be omitted or simplified. Additionally, the following description of the embodiments is merely exemplary in nature and is in no way intended to limit the invention, its application, or uses.

(First Embodiment)

FIG. 1 is a cross-sectional view of a package 1 according to the first embodiment. The package 1 of the first embodiment is shaped like a rectangular solid, having an accommodating area 7 which is formed so as to be surrounded by a package bottom 4 and sidewalls 3 erected perpendicularly on the package bottom 4. The package bottom 4 and the sidewalls 3 are made of metal plates. Incidentally, the walls constituting the package 1 need not necessarily be metal plates. For example, the walls may be made of resin plates, in which case a metal film is formed on the inside surfaces of the resin-plate walls, or the surfaces for facing or facing toward a radio frequency circuit. The metal film would then be connected to an external ground.

A planar circuit 5 is placed on the package bottom 4. The planar circuit 5 has a circuit board 6 on which microstrips and uniplanar transmission lines are formed. In FIG. 1, the planar circuit 5 is shown simply as a thin plate.

The board 6 of the planar circuit 5 is provided with a ground pattern which is formed on the surface opposed to the package bottom 4. This ground pattern is electrically connected to the package bottom 4 (i.e., the package 1) and by extension to a ground potential.

Shown at the top in FIG. 1 is a lid 2. The lid 2 is made of a metal plate 2a of predetermined thickness, detachably attached to the accommodating area 7 of the package 1. This lid 2 is electrically connected with the sidewalls 3. Besides, a conductor sheet 13 lying on the backside of a high impedance plate (hereinafter, referred to as HIP) 10 to be described later is bonded onto the surface of the lid 2 that faces the accommodating area 7, with electrical connection by means of soldering or the like. That is, in FIG. 1, the lid 2 corresponds to the formation wall of the present invention.

Figure 2A:
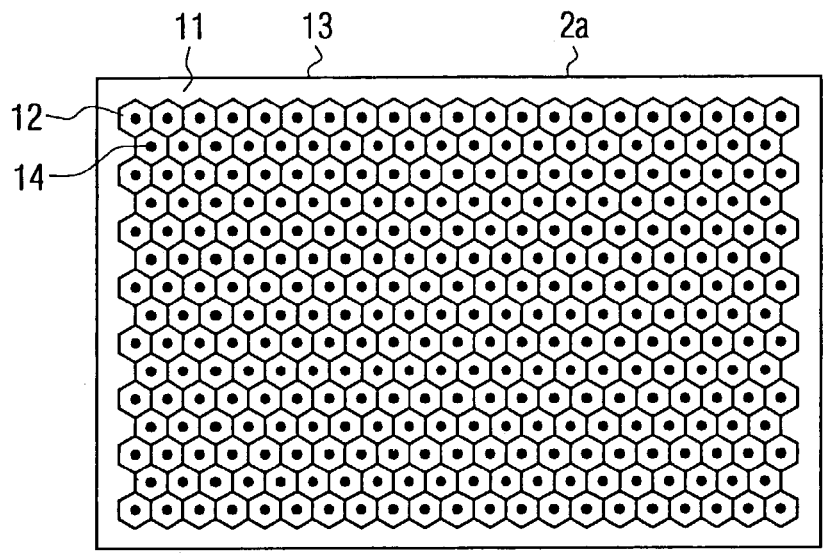
FIG. 2A is a plan view showing the inner side of a lid of the package according to the first embodiment.
Figure 2B:
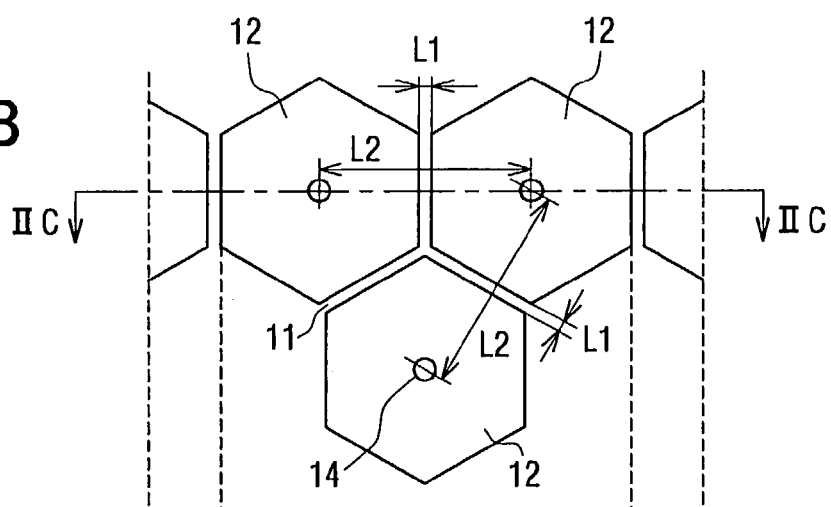
FIG. 2B is an enlarged partial view of FIG. 2A.
Figure 2C:
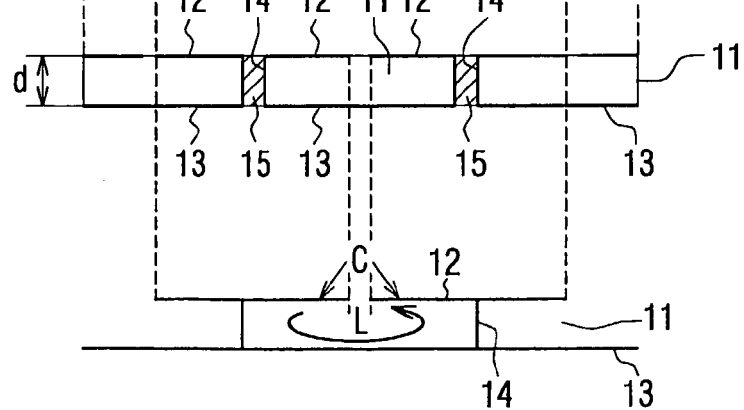
FIG. 2C is a cross-sectional view taken at line IIC-IIC of FIG. 2B.
Figure 2D:
FIG. 2D is a diagram showing the electric function corresponding to FIG. 2C.

Now, description will be given of the HIP 10 which is formed on the formation surface of the lid 2, the formation wall, of the first embodiment. FIG. 2A is a plan view of the HIP 10 of the first embodiment as seen from the formation-surface side. FIG. 2B is a plan view showing the dimensions and configuration of the HIP 10. FIG. 2C is a cross-sectional view of the HIP 10 with the formation surface facing upward. FIG. 2D is a diagram for explaining electric functions of the HIP 10 in cross section. FIG. 3 is a chart showing part dimensions and electric characteristics of the HIP 10 of the first embodiment shown in FIG. 2B in two design examples 1 and 2.

The HIP 10 of the first embodiment has a dielectric sheet 11, metal patches 12, and a backside conductor sheet 13. The dielectric sheet 11 has a thickness of d and a relative permittivity of ε. The metal patches 12 are regular hexagonal shapes and are periodically arranged in two dimensions on the formation-surface side of the dielectric sheet 11 (referred to as the surface of the HIP 10) with gaps of L1 between respective sides, or edges, of adjoining metal patches 12 and at a consistent pitch of L2. The backside conductor sheet 13 is formed over the entire backside of the dielectric sheet 11. Then, the metal patches 12 on the surface and the backside conductor sheet 13 are connected with each other at pitches L2 via through holes 14 of φ in diameter. The through holes 14 are connecting members having a metal film formed inside.

This HIP 10 can be fabricated easily by perforating the dielectric sheet 11 with small through holes to be the through holes 14 and printing the pattern of the regular hexagonal metal patches 12 on the surface in advance, and then forming metal film on the surface, the backside, and the through holes by metal plating or the like.

The interior 15 of the through holes 14 may simply penetrate through the dielectric sheet 11 with no lining and only pass air. Alternatively, as shown in FIG. 2C, the holes may be filled with metal or nonmetal material to protect the circuitry lying in the package 1 from the atmosphere outside the package. In either case, the HIP 10 has the same electric characteristics.

As shown in FIG. 2D, the HIP 10 having the foregoing structure can be considered a two-dimensional array of capacitances C and inductances L that are formed on the conductor sheet 13 by the metal patches 12 and the through holes 14. Known examples thereof include those described in U.S. Pat. No. 6,262,495. This conventional art discloses that the HIP 10 increases in impedance in a certain frequency band (band gap) Δf determined by its structure and dimensions and suppresses surface propagation of electromagnetic waves in the band gap Δf. The HIP 10 acts as a metal plate in frequency bands other than the band gap Δf and the HIP can be used as an antenna ground plane to suppress backside radiation from the antenna ground plane.

Incidentally, the HIP may be regarded as a form of photonic band gap material (PBGM). In a broad sense, the PBGM refers to a material or structure that contains a two-dimensional or three-dimensional periodic structure of dielectrics or metals, and inhibits or largely attenuates two-dimensional or three-dimensional propagation of electromagnetic waves in a certain frequency band, i.e., has high impedance in the two-dimensional or three-dimensional direction at the band gap.

In the package 1 of the first embodiment, such an HIP 10 is formed on an inner wall of the accommodating area 7 of the planar circuit 5. This can reduce the effect of isolation resulting from the planar circuit 5 being accommodated in the package 1. It is also possible to make the spaces between the planar circuit 5 and the respective walls of the package 1 as small as possible, i.e., reduce the size (occupied area and volume) of the package 1.

Figure 4A:
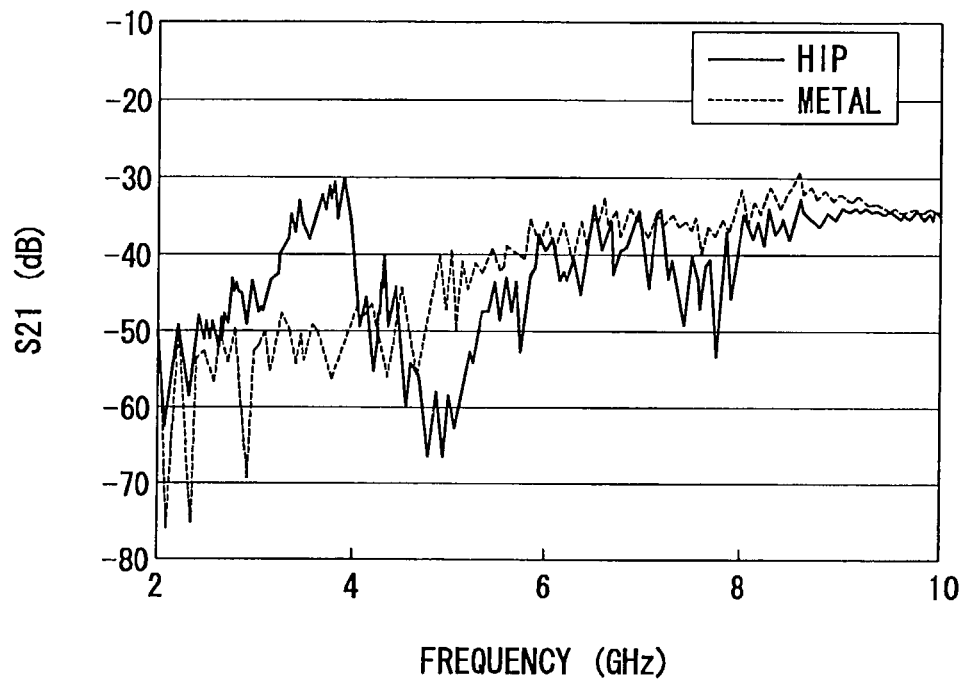
FIG. 4A is a graph showing electric characteristic measurements of the HIPs for use in the package of the first embodiment.
Figure 4B:
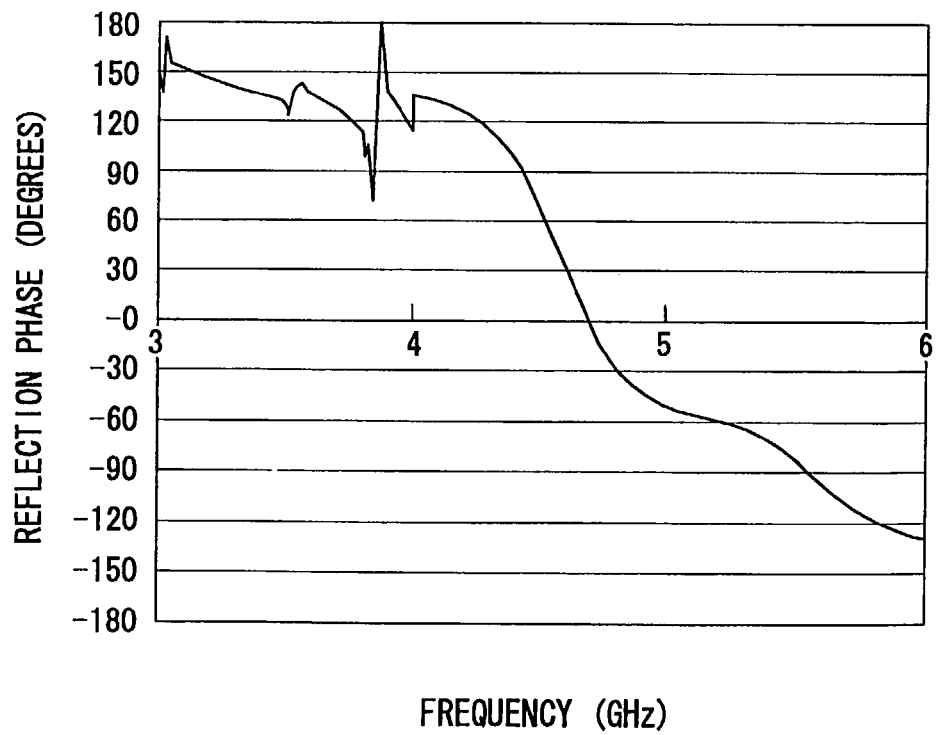
FIG. 4B is a graph showing electric characteristic measurements of the HIPs for use in the package of the first embodiment.

The following provides the results of characteristic tests for situations where the HIP 10 is formed on the inner wall of the package. FIGS. 4A and 4B are charts showing the frequency-to-S21 characteristic and frequency-to-reflection-phase characteristic of the HIP 10 according to design example 1 shown in FIG. 3, or surface wave measurements on the surface of the HIP 10. Note that FIG. 4A also includes the frequency-to-S21 characteristic of a metal plate for the purpose of comparison. From FIGS. 4A and 4B, it is shown that the HIP 10 of design example 1 has a resonant frequency f0 of 4.7 GHz (in free space, a wavelength λ=63.8 mm) and a band gap Δf lying near 4.3–5.6 GHz. Here, the resonant frequency f0 is calculated from the frequency at which the phase in the reflection phase characteristic becomes zero.

Figure 5A:
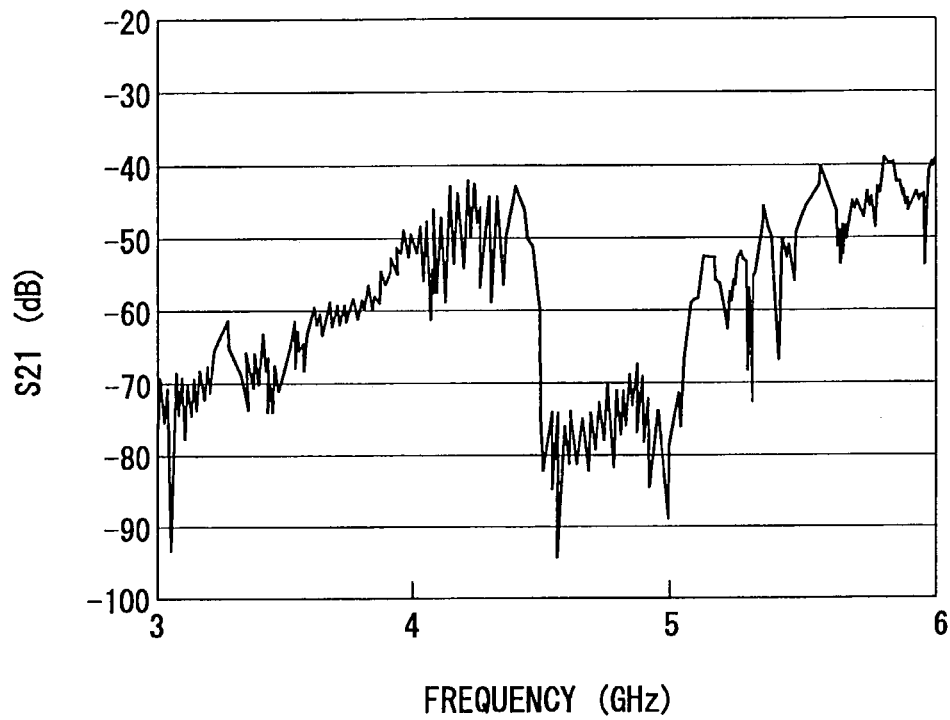
FIG. 5A is a graph showing electric characteristic measurements of the HIPS for use in the package of the first embodiment.
Figure 5B:
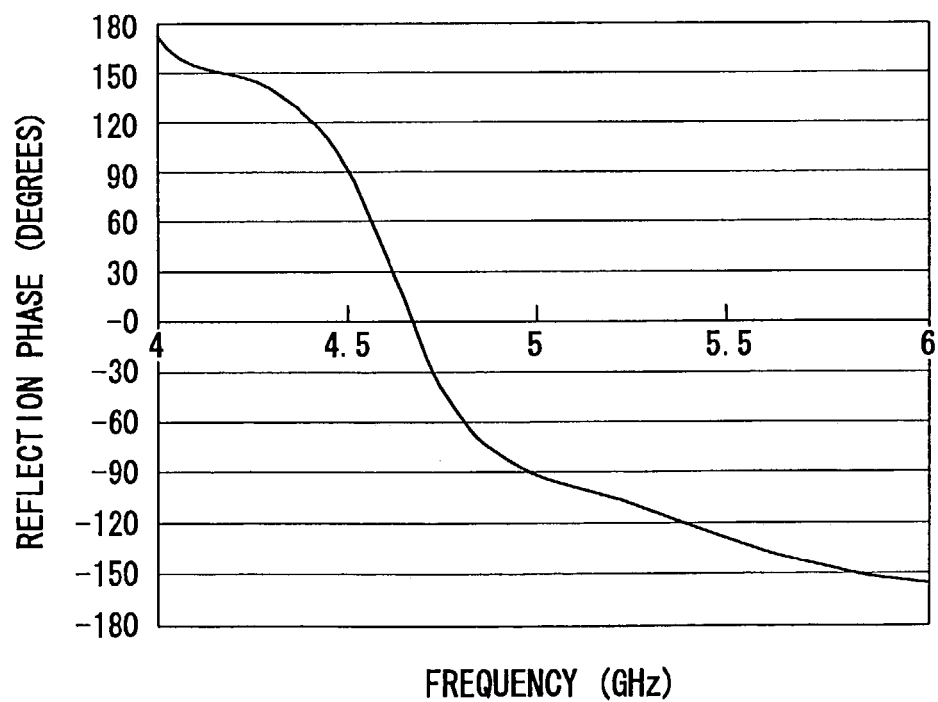
FIG. 5B is a graph showing electric characteristic measurements of the HIPS for use in the package of the first embodiment.

FIGS. 5A and 5B show the frequency-to-S21 characteristic and frequency-to-reflection-phase characteristic of the HIP 10 in design example 2. From the charts, it is shown that the HIP 10 of design example 2 has a resonant frequency f0 of 4.8 GHz (λ=62.5 mm) and a band gap Δf lying near 4.6–5.0 GHz.

In design examples 1 and 2, the periodic structure pitches P (=L2/λ) of the HIPs 10 at the respective resonant frequencies f0 are 0.11λ and 0.08λ.

Figure 6A:
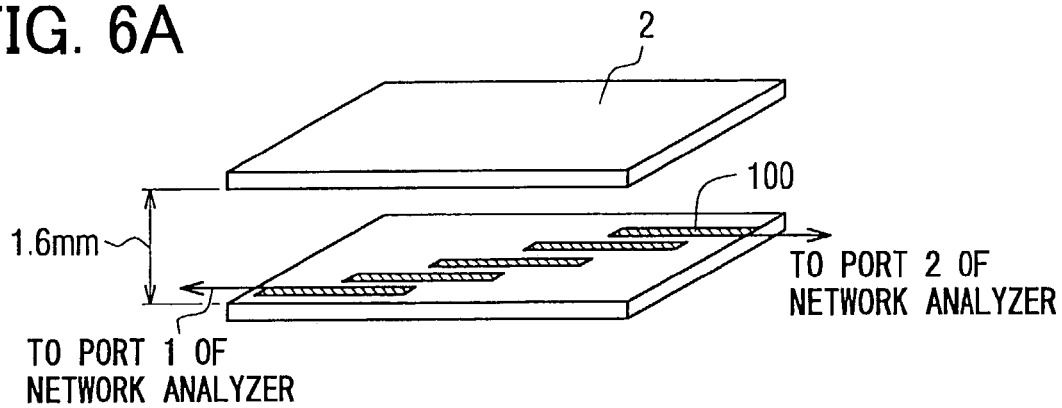
FIG. 6A is a diagram showing a measuring system for evaluating a proximity effect between the lid and the planar circuit in the package of the first embodiment.
Figure 6B:
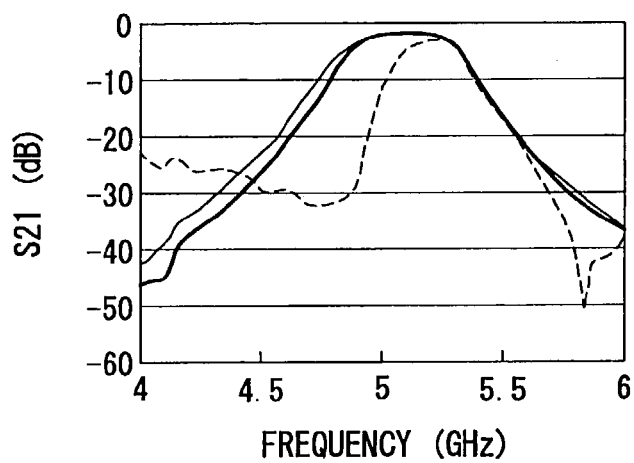
FIG. 6B is a chart showing measurements taken by the measuring system of FIG. 6A.
Figure 6C:
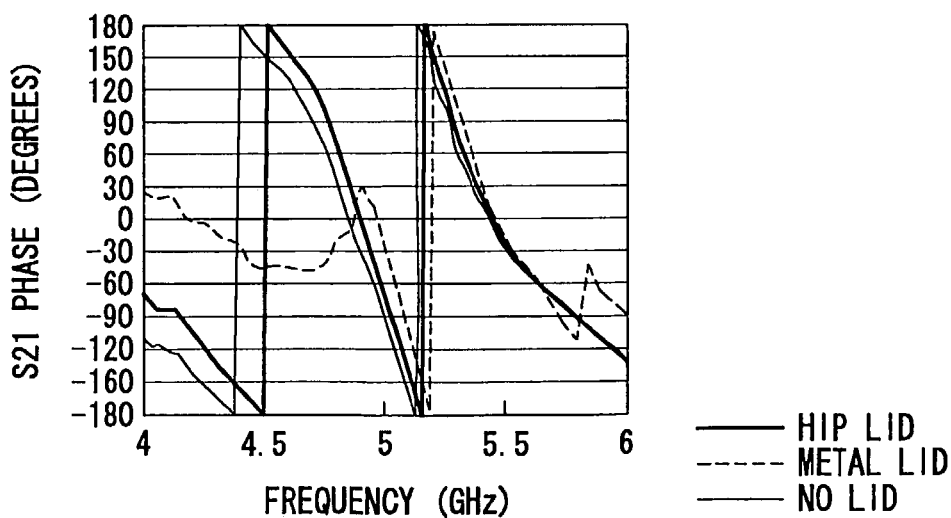
FIG. 6C is a chart showing measurements taken by the measuring system of FIG. 6A.

FIG. 6A shows the measuring system for examining the effect on the planar circuit 5 when the lid 2 of the package 1 is located near the planar circuit 5. FIGS. 6B and 6C show the measurements. In FIG. 6A, rectangular microstrip filters 100 are bonded on a metal plate 500 which corresponds to the planar circuit. A lid 2, which is identical in size to the metal plate 500, is placed in parallel with the metal plate 500 at a distance of 1.6 mm. In this state, a first port and a second port of a network analyzer (not shown) were connected across the metal plate 500 for measurement. Here, the lid 2 was provided for the following three cases: i) one having the HIP 10 of design example 1 with the surface side (i.e., the side of the metal patches 12) toward the microstrip filters 100; ii) a simple metal plate; and iii) no lid.

The amplitude characteristic, or frequency-to-S21 characteristic, of FIG. 6B shows that in the band gap 4.3–5.6 GHz of the HIP 10: i) the HIP-formed lid lying as close as the interval of 1.6 mm presented almost the same characteristic as in the case of iii) no lid. In contrast, ii) the simple metal-plate lid lying in proximity caused characteristic changes both in amplitude characteristic and phase characteristic. The distance of 1.6 mm corresponds to approximately 3% of the wavelength of the frequency band to be measured. From the results, it is shown that the HIP 10 can be located near the planar circuit 5 with no characteristic change as compared to the case of no lid.

An explanation thereof is as follows. The inventors have considered that when the lid 2 of the package 2 is located near the planar circuit 5, the planar circuit 5 causes characteristic variations due to image currents flowing in the package 1 itself which cancel the currents in the planar circuit 5. To reduce the characteristic variations, the package 1 must be configured to block these image currents without impairing the electromagnetic field shielding effect which is the original objective of the package 1.

In view of this, as in the HIP 10 described above, the dielectric 11 and the metal electrodes (metal patches 12) grounded through the backside conductor sheet 13 are combined to form a two-dimensional resonant circuit consisting of inductances and capacitances. Then, the resonant circuit can be set to have a high Q in the resonant frequency band so that high resonance occurs on the surface of the HIP 10. This means a high impedance in this frequency band, thereby precluding image currents. Incidentally, in such a structure of the HIP 10 as shown in FIGS. 2A to 2C, the formation of the metal patches 12 on the dielectric sheet 11 can shrink the periodic structure, or the periodic structure pitch P in FIG. 3, due to the wavelength reduction rate of the dielectric. This equivalently allows an increased number of metal electrodes (metal patches 12) per unit wavelength of the signal to be used in the package 1, and thus allows an increase in the resonance intensity.

Under the effect of such a high resonance characteristic, the distance between the planar circuit 5 and the opposing lid 2 of the package 1 can be reduced to approximately 3% of the wavelength with little influence on the operation of the planar circuit 5.

Figure 7A:
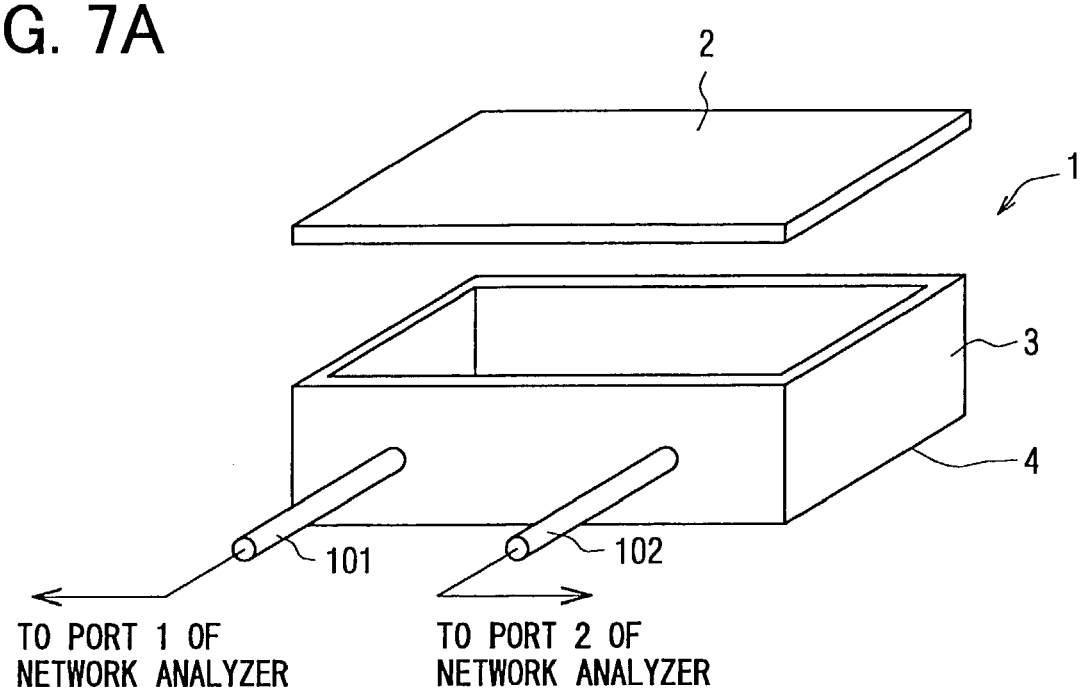
FIG. 7A is a diagram showing a system for measuring the package of the first embodiment for isolation characteristics.
Figure 7B:
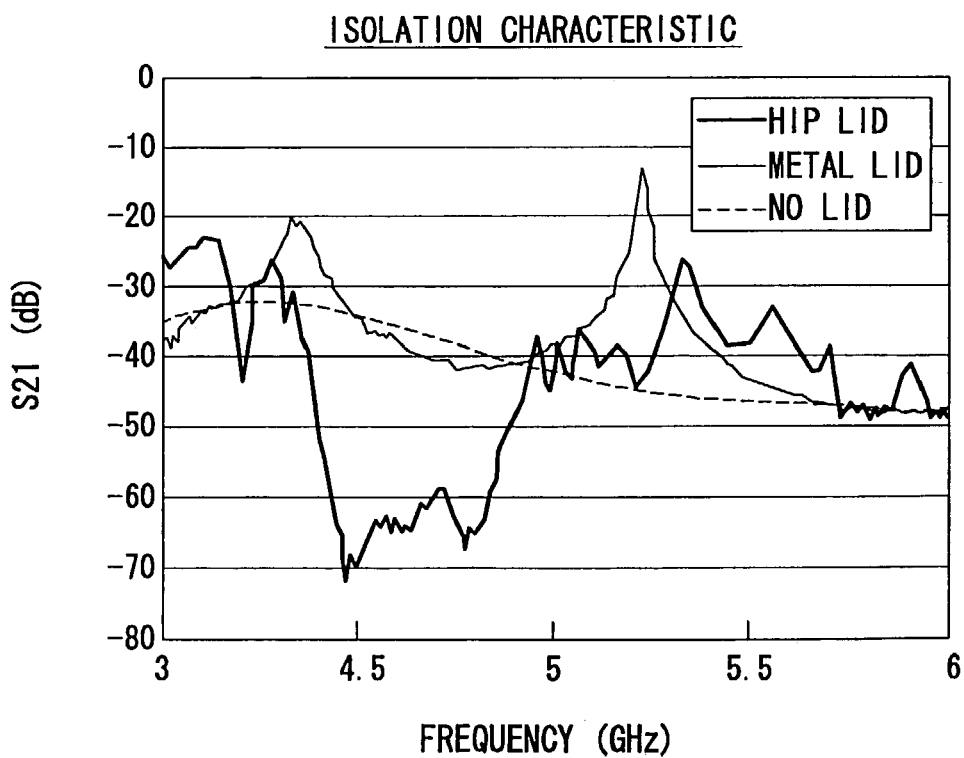
FIG. 7B is a chart showing measurements taken in conjunction with the system of FIG. 7A.

Next, description of the result of measurement on the isolation characteristic in a metal box, or the package 1 will be provided. FIG. 7A is a diagram showing the measuring system while FIG. 7B shows the measurements. As shown in FIG. 7A, a rectangular-solid metal box 1 having dimensions of length×width×height=48×98×22 (mm), closed with the lid 2, was equipped with two measuring probes 101 and 102 which were inserted at almost the longitudinal center of a sidewall 3. The probes were connected to the first and second ports of a network analyzer (not shown) for measurement. The lid 2 of this metal box was provided for the following three cases: the lid 2 having the HIP 10 of design example 2 formed on its inside surface; the lid 2 having a metal plate inside surface; and no lid (i.e., an open top).

FIG. 7B shows the results of examination of the frequency-to-S21 characteristic as the isolation characteristic inside the metal box 1. With reference to the isolation characteristic in the case of no lid, the test results show a large signal attenuation within the frequency band of the band gap Δf of the HIP 10, or an improvement in isolation characteristic, when the HIP 10 is used as the lid 2. With the metal lid, on the other hand, two peaks appear which are ascribable to the formation of standing waves inside the metal box 1. The isolation characteristic is even poorer than in the case of no lid.

The package 1, which is the rectangular, solid metal box shown in FIG. 7A, has a height smaller than the dimensions (length or width) of the lid 2. The accommodating area 7, that is, the space inside the package 1, thus functions as a rectangular waveguide in which propagation occurs by a propagation mechanism similar to that in a waveguide (waveguide mode). That is, the electric-field vector occurring in the package 1 is oriented parallel with the direction orthogonal to the surfaces of the lid 2 and the bottom 4. Given that the inside surface of the lid 2 of the package 1 is the formation surface of the HIP 10, this formation surface corresponds to a plane orthogonal to the electric field occurring in the package 1. It is therefore possible to suppress the propagation of unwanted waves inside the package 1.

As above, in the first embodiment, the HIP 10 shown in FIG. 2A to FIG. 2C is formed on the formation surface of the formation wall facing toward the interior of the package 1, with the lid 2 of the rectangular-solid package 1 surrounded by metal walls as the formation wall. This produces the electromagnetic field shielding effect between the planar circuit 5 located on the bottom 4 of the package 1 and the exterior of the package 1. In addition, the isolation capability inside the package 1 can be enhanced to the same extent as in the case of no lid even if the distance between the lid 2 and the planar circuit 5 is made smaller. It is therefore possible to provide a package having a small size and a high isolation capability.

(Second Embodiment)

Figure 8A:
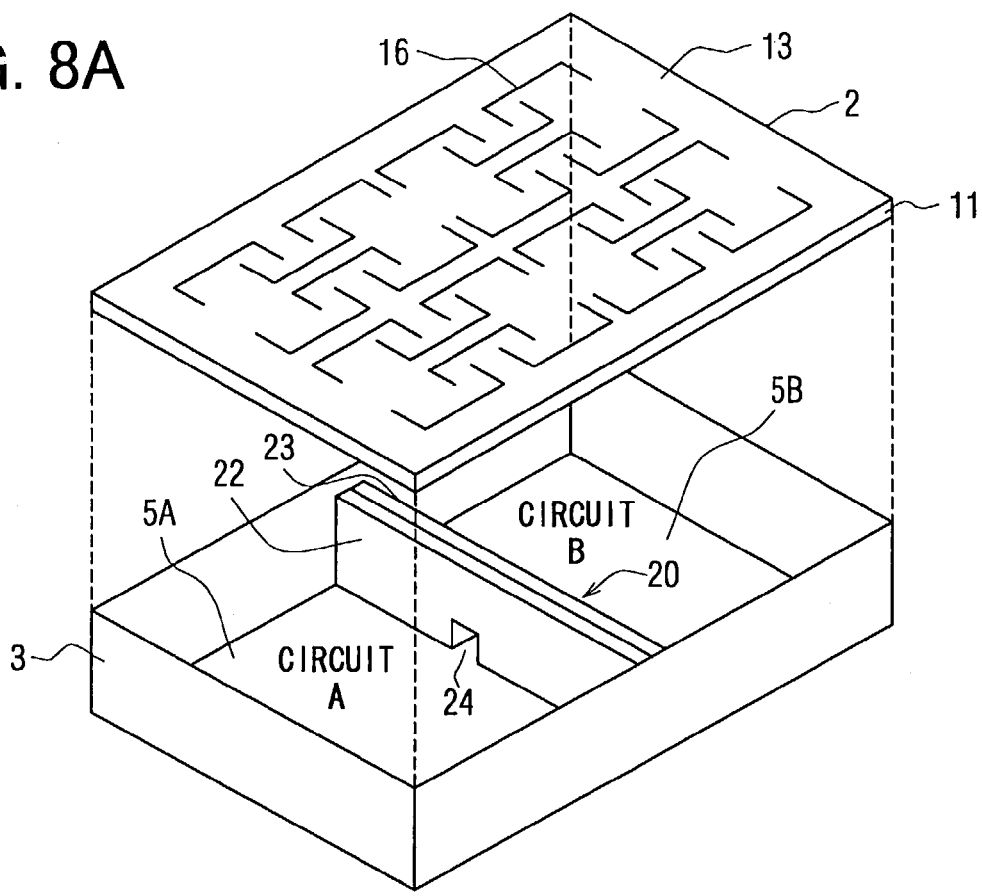
FIG. 8A is a perspective view of the package without a lid according to the second embodiment of the present invention.
Figure 8B:
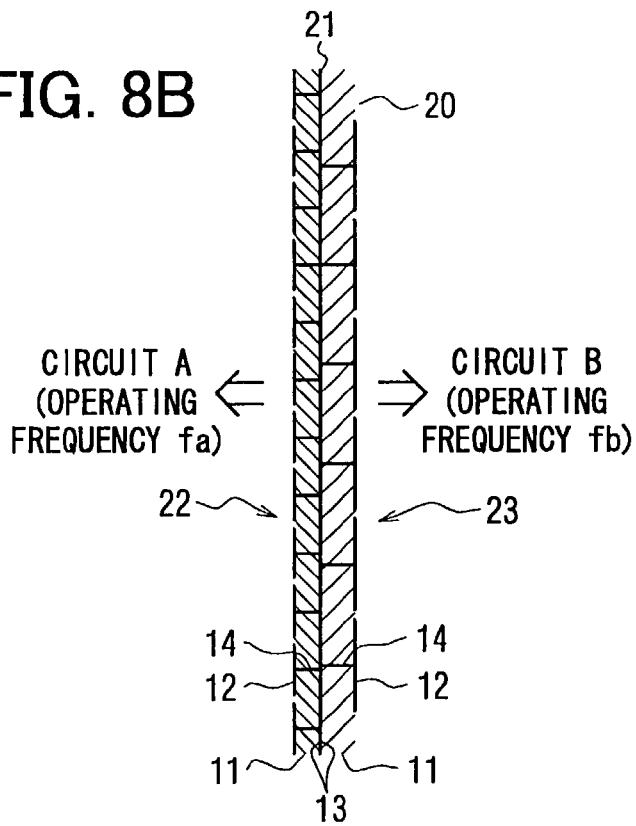
FIG. 8B is a cross-sectional view of a partition according to the second embodiment.
Figure 8C:
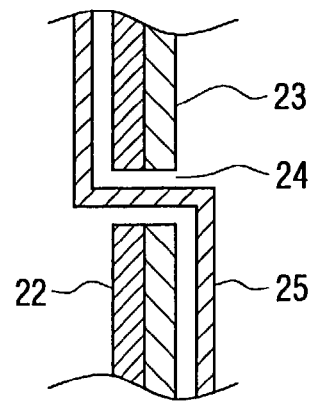
FIG. 8C is a cross-sectional view showing the physical relationship between an opening in the partition and a transmission line according to the second embodiment.

As shown in FIGS. 8A to 8C, the package according to a second embodiment of the present invention differs from the first embodiment in that the lid is completely made of an HIP alone, and the interior of the package is divided into two portions corresponding to two planar circuits A and B for mutual shielding and is provided with a partition which has HIPs on its surfaces.

The lid 2 is made of a dielectric sheet 11 that has a two-dimensional periodic array of regular, hexagonal metal patches 12 on its surface (i.e., HIP surface) and a backside conductor sheet 13 on its backside, as in FIGS. 2A to 2C above, with no other members. Since the dielectric sheet 11 is to bear the strength of the lid 2, a plurality of slits 16 tracing closed curves are formed in the backside conductor sheet 13 to reduce the stress difference between the surface and backside of the dielectric sheet 11. This results in uniform stress across the HIP 10, thereby preventing the HIP 10 from warping. The conductor sheet 13 lying on the backside of the lid 2 which constitutes an external wall of the package 1 is electrically connected with the other sidewalls 3 of the package 1.

The accommodating area 7 inside the package 1 accommodates planar circuits 5A and 5B of different operating frequencies. The two are divided by a partition 20. As shown sectioned in FIG. 8B, the partition 20 has two types of HIPS 22 and 23 of different band gaps which are formed on respective sides of a metal plate 21.

As shown in FIG. 8B, the formation surface of the partition 20 that faces the planar circuit 5A is provided with the HIP 22. The HIP 22 is designed to have a band gap that covers the operating frequency of the planar circuit 5A. Similarly, the formation surface of the partition 20 on the opposite side is provided with the HIP 23. The HIP 23 is designed to have a band gap that covers the operating frequency of the planar circuit 5B.

This partition 20 can be formed by forming desired metal patches 12, through holes 14, and backside conductor sheets 13 on and in respective dielectric sheets 11 to fabricate the HIPs 22 and 23 in advance, and then pasting the backside conductor sheets 13 of the HIPs 22 and 23 onto the respective sides of the metal plate 21 of the partition 20 with electric connection.

As shown in FIG. 8C, the package bottom 4 of the partition 20 has an opening 24 for a transmission line 25 to pass through for connecting the planar circuits A and B. Incidentally, FIG. 8C shows the HIPs 22 and 23 of the partition 20 in a simplified manner.

When the package 1 contains a plurality of circuit blocks and the blocks are mutually shielded by metal-plate partitions, and particularly when the metal partitions are located near transmission lines, image currents flowing through the metal partitions can affect the impedances of the transmission lines, i.e., change the circuit characteristics.

In the second embodiment however, the HIPs 22 and 23 having the desired band gaps are formed on both sides of the partition 20, so that no image current flows through the HIP partition 20 even if the partition 20 is arranged near the transmission line 25 or the like. It is therefore possible to provide a package 1 which is small in size and constant in circuit characteristic. Besides, the metal plate 21 lying at the center of the partition 20 (corresponding to the backside conductor sheet 13 of the HIP) can shield the two circuit blocks from each other.

Moreover, in the package 1 of the second embodiment, the lid 2 is made of the HIP 10 alone. The lid 2 can thus be rendered smaller in thickness, allowing a reduced height dimension of the package 1. Since the conductor sheet 13 on the backside of the lid 2 (outside of the package) has the slits 16, the lid 2 can be prevented from warping.

Incidentally, the partition 20 may be made of PBGMs (photonic band gap materials) other than the HIPs 22 and 23.

For example, the partition may be a metal plate on both sides of which dielectric sheets having periodic holes or printed circuits having periodic metal patterns are bonded as the PBGMs. Then, the spaces on both sides of the partition can be surely shielded from each other without radio frequency signals passing through the partition 20.

(Third Embodiment)

Figure 9A:
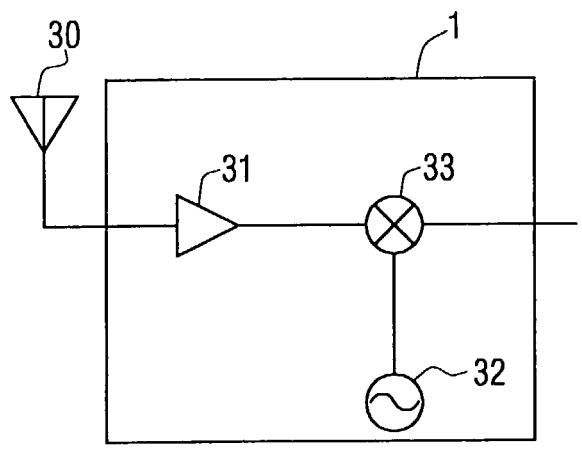
FIG. 9A is a functional block diagram of a planar circuit according to a third embodiment of the present invention.
Figure 9B:
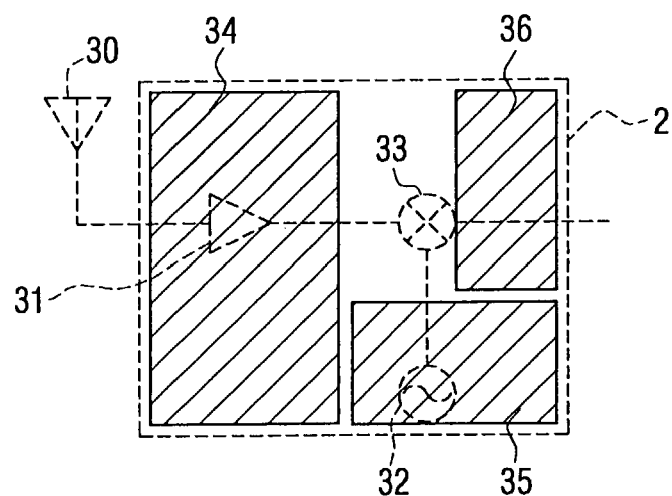
FIG. 9B is a diagram showing an arrangement of HIPs formed on the lid according to a third embodiment of the present invention.
Figure 9C:
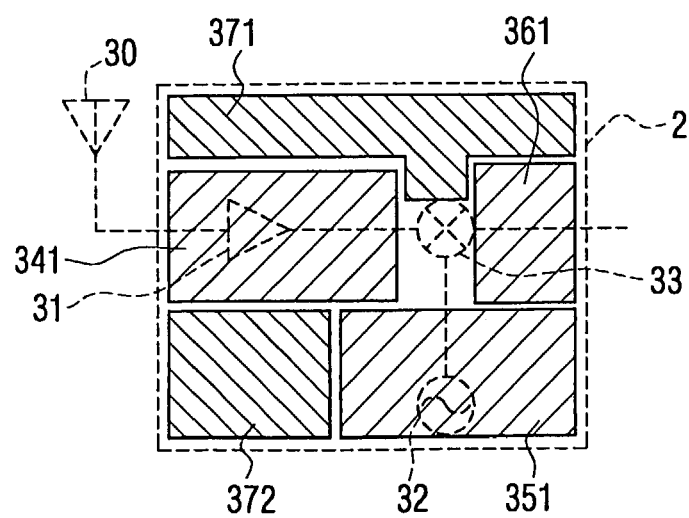
FIG. 9C is a diagram showing another arrangement of HIPs formed on the lid according to a third embodiment of the present invention.

The package 1 according to a third embodiment of the present invention differs from the foregoing first embodiment in that the HIP 10 to be formed on the lid 2 is configured to have different band gaps Δf in accordance with the function blocks of the planar circuit 5 as shown in FIGS. 9B and 9C. FIG. 9A is a plan view showing the planar circuit 5 placed on the bottom 4 inside the package 1 as function blocks. FIGS. 9B and 9C are projections of the lid 2 of the package 1 onto the bottom 4, showing two examples of arrangement of the HIP 10 formed on the formation surface of the lid 2 with respect to the planar circuit 5 of FIG. 9A.

As shown in FIG. 9A, the planar circuit 5 lying in the package 1 has a down converter which consists of a low noise amplifier 31 for amplifying the signal (frequency f1) from an antenna 30 lying outside the package 1, a local oscillator (frequency f2<f1) 32, and a mixer 33 for mixing the output of the low noise amplifier 31 and the output of the local oscillator 32. In such a case, the planar circuit 5 has different operating frequencies for the respective blocks.

Then, the HIP 10 to be formed on the formation surface of the lid 2 is arranged to have different band gaps in accordance with the operating frequencies of the respective function blocks of the planar circuit 5 lying directly below.

More specifically, in the example of the third embodiment shown in FIG. 9B, a rectangular HIP 34 having a band gap that covers the operating frequency f1 of the low noise amplifier 31 is arranged right over the low noise amplifier 31 and the input and output transmission lines thereof as an HIP intended for an RF signal. A rectangular HIP 35 having a band gap that covers the operating frequency f2 of the local oscillator 32 is arranged right over the local oscillator 32 and the output transmission line thereof as an HIP intended for an Lo signal. Moreover, a rectangular HIP 36 having a band gap that covers the frequency (f1–f2) of the output signal of the mixer 33 is arranged right over the output transmission line of the mixer 33 as an HIP intended for an IF signal. Here, the lid 2 has no HIP directly above the mixer 33 since the mixer 33 uses three frequencies (f1, f2, and f1–f2).

The HIP to be formed on the lid 2 of the package 1 is thus composed of the HIPs 34, 35, and 36 which have different band gaps for the respective function blocks of the planar circuit lying directly below. This configuration can suppress the occurrence of image currents in the respective portions of the planar circuit 5, and suppress signal propagation in waveguide mode including an electric-field vector component perpendicular to the surface (HIP formation surface) of the lid 2 of the package 1.

In the example of the third embodiment shown in FIG. 9C, the HIP to be formed on the lid 2 is sectioned more finely than in the foregoing example. As with the foregoing example, an HIP 341 intended for an RF signal, an HIP 351 intended for a Lo signal, and an HIP 361 intended for an IF signal, having band gaps corresponding to respective operating frequencies, are arranged right over the transmission lines which are the channels for signal propagation. Besides, portions not directly opposed to the transmission lines are provided with anti-spurious HIPs 371 and 372 having a band gap that covers one of the spurious frequencies occurring from the planar circuit.

Here, spurious refers to unwanted, harmful radiation a circuit generates with frequency components different from the operating frequencies of the individual portions of the circuit. When the spurious radiation frequency propagates across the circuit blocks in the package 1 and leaks from the input side to the output side, the circuit operation may become unstable. In the case of the circuit shown in FIG. 9A above, this spurious radiation frequency can cause a plurality of frequencies fs given by fs=(n+1)×f1−n×f2.

Then, as shown in FIG. 9C, the HIPs 371 and 372 having a band gap that covers one of the spurious frequencies fs are arranged over the portions of the pattern of the planar circuit 5 where none of the transmission lines and the like exist in fact. This makes it possible to prevent the spurious from propagating through the package 1, so that the planar circuit 5 can be improved in stability. In addition, as with the effect of the example of FIG. 9B above, it is possible to suppress the occurrence of image currents in the respective portions of the planar circuit 5 and suppress signal propagation in waveguide mode including an electric-field vector component perpendicular to the surface (HIP formation surface) of the lid 2 of the package 1.

(Fourth Embodiment)

The package 1 according to a fourth embodiment of the present invention differs from the foregoing first embodiment in that one of the external walls constituting the package 1 is provided with a connector 40 through which a signal on the planar circuit is taken out.

Figure 10:
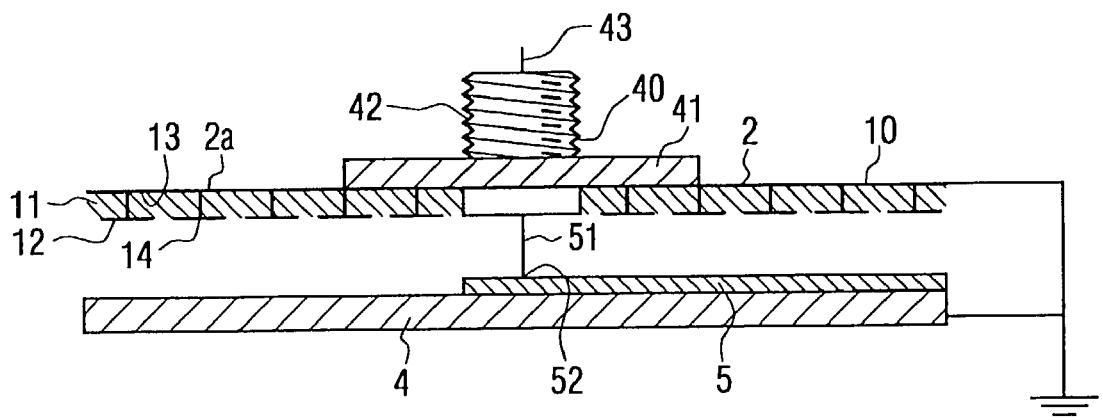
FIG. 10 is a diagram showing a partial cross-sectional view of the package according to a fourth embodiment of the present invention.

FIG. 10 shows part of a cross section of the package 1 according to the fourth embodiment. The inner wall surface of the lid 2 of the package 1 serves as the formation surface of the HIP 10. The HIP 10, designed to have a band gap Δf that covers the operating frequency of the planar circuit 5, is formed with its surface toward the planar circuit 5 which is located on the package bottom 4.

On the outside of the lid 2, a flange 41 of the connector 40 is connected in conduction with the conductor sheet 13 lying on the backside of the HIP 10. The connector 40 is threadedly engaged with an external conductor of a not-shown coaxial cable by means of its male thread portion 42 which is at the same potential as the flange 41. The internal conductor of the coaxial line is connected with a central conductor 43 of the connector 40 which leads inside the package 1. The package bottom 4, the ground pattern of the planar circuit 5, and the backside conductor sheet 13 of the HIP 10 are all connected to a ground potential.

The central conductor 43 of the connector 40 is connected with a signal line 51 which is led from a signal outlet part 52 of the planar circuit 5. In the configuration described above, a signal is taken out from the planar circuit 5 outside the package 1 through the signal line 51, the central conductor 43 of the connector 40, and the internal conductor of the not-shown coaxial line.

In conventional packaging circuits, signals have been taken out from a side or backside of the package. The reason for this is that the lid of the package and the planar circuit require a gap therebetween such that no characteristic of the planar circuit varies. When signals were taken out through the lid, the vertical lines for taking out the signals from the planar circuit would have greater lengths which might hinder lossless signal transmission. This has heretofore resulted in low wiring flexibility outside the package.

In contrast, according to the package 1 of the fourth embodiment, the HIP 10 is formed on the inside surface (formation surface) of the lid 2 of the package 1. This makes it possible to reduce the gap between the surface of the HIP 10, or the inside surface of the lid 2, and the planar circuit 5. The signal line 51 for taking out the signal from the planar circuit 5 can thus be led out through the lid 2 having the HIP 10 formed thereon, which allows higher wiring flexibility outside the package 1.

(Fifth Embodiment)

The package 1 according to a fifth embodiment of the present invention differs from the fourth embodiment in that another planar circuit 5b is arranged on the external wall of the package instead of the connector 40 of the fourth embodiment.

Figure 11:
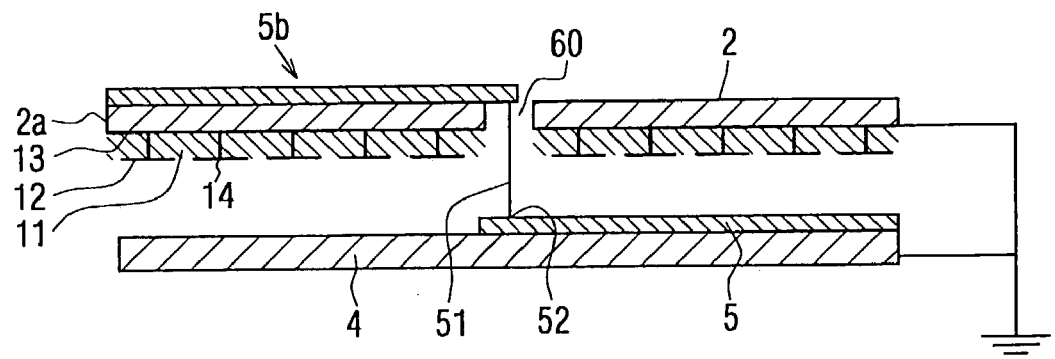
FIG. 11 is a diagram showing a partial cross-sectional view of the package according to a fifth embodiment of the present invention.

FIG. 11 shows part of a cross section of the package 1 according to the fifth embodiment. The lid 2 of the package 1 is made of a grounded metal plate 2a. The HIP 10 is formed with the inside surface of this metal plate 2a as the formation surface. The HIP 10 has a band gap $\Delta f$ that covers the operating frequency of the planar circuit 5 in the package 1. Moreover, the HIP 10 has a hole 60 for signal outlet. This hole 60 may have an area equivalent to a single metal patch 12 formed on the surface of the HIP 10, for example.

A hole 60 is also formed in the metal plate 2a of the lid 2 so as to coincide with the signal-outlet hole 60 in the HIP 10. The external planar circuit 5b is arranged on the backside of the metal plate 2a of the lid 2, i.e., on the outside surface of the lid 2. The external planar circuit 5b and the internal planar circuit 5 are connected with the signal line 51 through the holes 60.

Again, in this fifth embodiment, the HIP 10 is formed on the inside surface (formation surface) of the lid 2 of the package 1 to reduce the gap between the lid 2 and the planar circuit 5 lying in the package 1. Besides, the external planar circuit 5b arranged on the outside surface of this lid 2 and the internal planar circuit 5a are connected with the signal line 51 through the holes 60 which are formed in the lid 2 and the HIP 10. The length of the signal line can thus be reduced for lossless signal transmission.

The hole 60 for signal outlet, formed in the lid 2 of the package 1, is sized similar to a metal patch 12 of the HIP 10 for easy perforation. Due to the small size of the hole itself, the package 1 will not be deteriorated in shielding performance.

(Sixth Embodiment)

Figure 12:
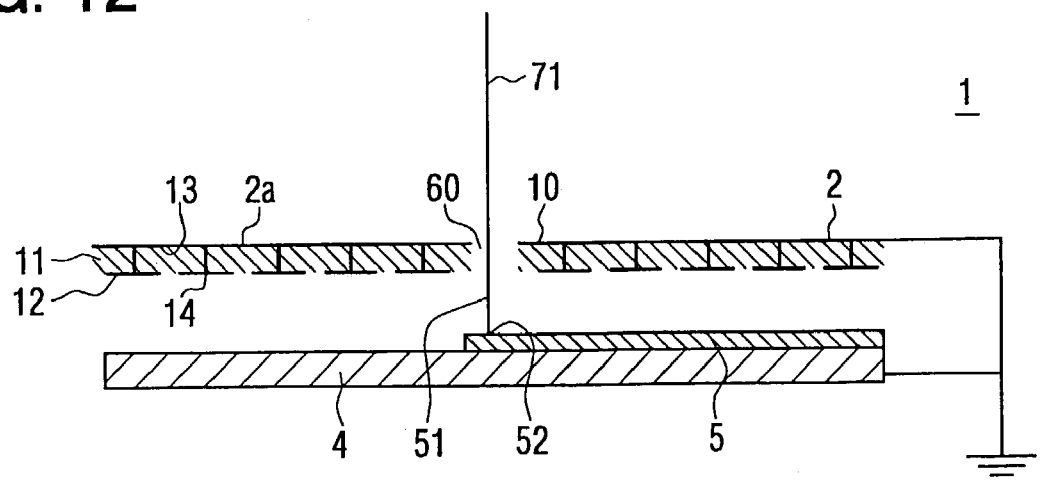
FIG. 12 is a showing a partial cross-sectional view of the package according to a sixth embodiment of the present invention.

The package according to a six embodiment of the present invention differs from the foregoing fourth and fifth embodiments in that an element antenna is arranged on the outside surface of the lid 2. FIG. 12 shows part of a cross section of the package 1 according to the sixth embodiment.

As with the foregoing embodiments, the inside surface of the lid 2 of the package 1 serves as the formation surface on which the HIP 10 having a band gap $\Delta f$ that covers the operating frequency of the planar circuit 5 is formed to face the planar circuit 5 placed on the package bottom 4, with its metal patches 12 toward the planar circuit 5. In this sixth embodiment, the conductor sheet 13 constituting the backside of the HIP 10 is the outermost surface of the lid 2 of the package 1.

The lid 2 has a hole 60 for signal outlet, with a size equivalent to a single metal patch 12 on the HIP 10. A signal line 51 is led from a signal outlet part 52 of the planar circuit 5. A monopole antenna 71, or the element antenna, is connected with the signal line 51.

The monopole antenna 71 is fed by the signal line 51, or feed line, with the conductor sheet 13 behind the HIP 10 constituting the outside surface of the lid 2 as the antenna ground plane. The monopole antenna 71 extends upward in FIG. 12 from the outermost position of the lid 2, perpendicularly to the outside surface of the lid 2. Consequently, this monopole antenna 71 exhibits, in its upper half, the radiation characteristic of a dipole antenna with respect to the outside surface of the lid 2.

In the package 1 of the sixth embodiment, the monopole antenna 71 is arranged directly on the outside surface of the lid 2 of the package 1 having the HIP 10 formed inside, and this monopole antenna 71 is directly fed by the planar circuit 5 in the package 1 by using the signal line 51 through the hole 60 which is formed in the HIP 10. It is therefore possible to reduce the length of the feed line leading to the monopole antenna 71. Consequently, impedance matching between the antenna 71 and the planar circuit 5 is facilitated, and the antenna can be arranged on the lid 2 of the package 1 with increased flexibility in antenna arrangement.

Since it is sized similar to a metal patch 12 of the HIP 10, the hole 60 for signal outlet can be easily formed in the lid 2 of the package 1. In addition, due to the small size of the hole 60 itself, the shielding performance of the package 1 will not deteriorate.

(Seventh Embodiment)

Figure 13:
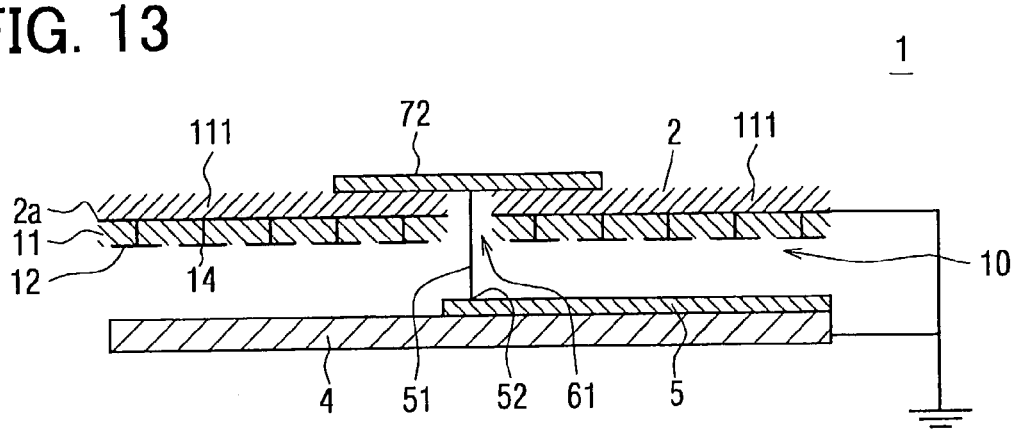
FIG. 13 is a diagram showing a partial cross-sectional view of the package according to a seventh embodiment of the present invention.

The package according to a seventh embodiment of the present invention differs from the foregoing sixth embodiment in that a patch antenna 72 is used instead of the monopole antenna 71. FIG. 13 shows part of a cross section of the package 1 according to the seventh embodiment. The HIP 10 lying on the inside surface of the lid 2 of the package 1 is the same as in the foregoing sixth embodiment. Description thereof will thus be omitted here.

A dielectric sheet 111 is formed on the backside of the lid 2, or the outside surface of the package 1, over the grounded conductor sheet 13 behind the HIP 10. A circular patch antenna 72 made of a metal film, for example, is formed on the surface of the dielectric sheet 111 (i.e., on the outermost surface of the lid 2).

A hole 61 having a size equivalent to a single metal patch 12 on the HIP 10 is formed in the dielectric sheet 111 and the HIP 10 behind the patch antenna 72. Through the hole 61, the planar circuit 5 and the backside of the patch antenna 72 are connected with the signal line 51, or feed line, which is led from the signal outlet part 52 of the planar circuit 5. The patch antenna 72 is then fed by the signal line 51, or feed line, with the backside conductor sheet 13 of the HIP 10 lying on the outside of the lid 2 as the antenna ground plane.

In the foregoing configuration, the patch antenna 72 is arranged directly on the outside surface of the lid 2 of the package 1 having the HIP 10 formed inside, via the dielectric sheet 111, and this patch antenna 72 is directly fed by the planar circuit 5 in the package 1 by using the signal line 51 through the hole 61 which is formed in the HIP 10 and the dielectric sheet 111. The package 1 of the seventh embodiment can thus reduce the length of the feed line leading to the patch antenna 72. Consequently, as in the foregoing sixth embodiment, impedance matching between the antenna and the planar circuit is facilitated, and the antenna can be arranged on the lid 2 of the package 1 with increased flexibility in antenna arrangement.

Since it is sized similar to a metal patch 12 of the HIP 10, the hole 61 for signal outlet can be formed in the lid 2 of the package 1 easily. In addition, due to the small size of the hole itself, the shielding performance of the package 1 will not deteriorate.

Figure 14:
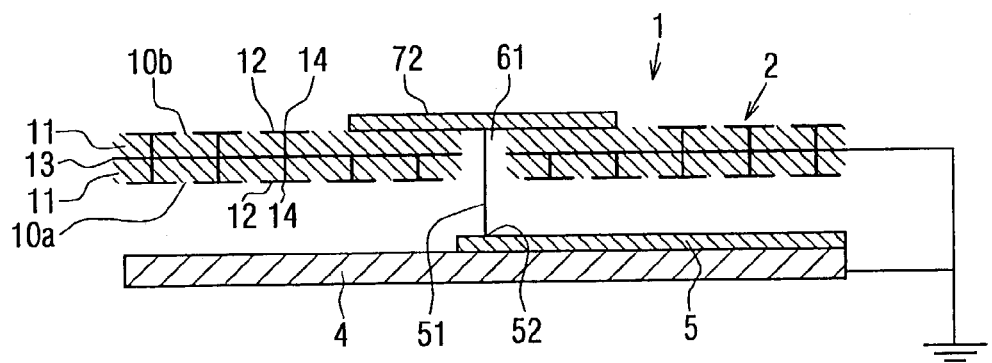
FIG. 14 is a diagram showing part of a cross-sectional view of another example of the package according to the seventh embodiment.

For another example of the seventh embodiment, the surface of the outermost dielectric sheet 11 of the lid 2 of the package 1 may be provided with a two-dimensional array of metal patches 12 identical to those on an inner HIP 10a as shown in FIG. 14. This forms an HIP 10b having a band gap $\Delta f$ that covers the operating frequency of the planar circuit 5, i.e., the resonant frequency of the patch antenna 72. In such a case, the HIP 10b arranged on the outside surface of the lid 2 prevents the radiation waves from the patch antenna 72 arranged on the outside surface of the lid 2 from propagating along the HIP surface. This can suppress so-called rear radiation, thereby avoiding deterioration of antenna characteristics.

(Eighth Embodiment)

Figure 15:
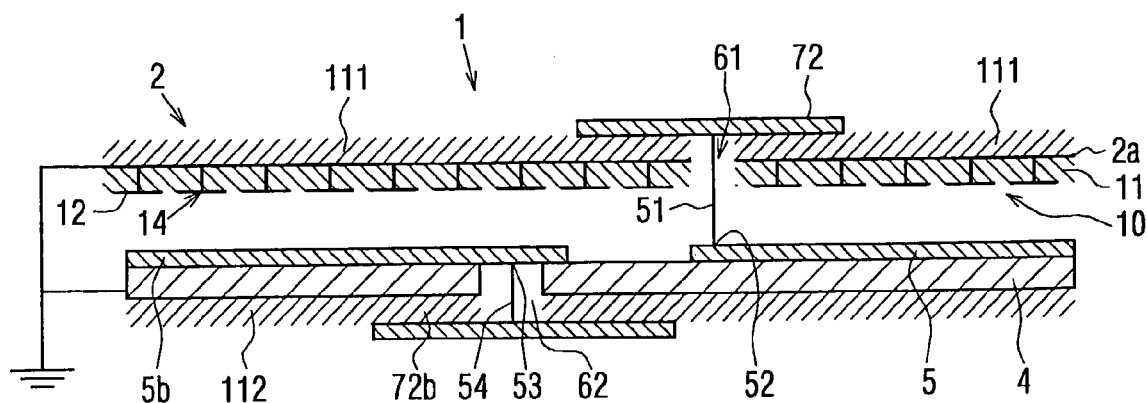
FIG. 15 is a diagram showing a partial cross-sectional view of the package according to an eighth embodiment of the present invention.

The package 1 according to an eighth embodiment of the present invention is the package 1 of the foregoing seventh embodiment in which another patch antenna 72b is arranged on the bottom 4 thereof. FIG. 15 shows a partial cross-section of the package 1 according to the eighth embodiment. The lid 2 of the package 1 is the same as in the foregoing seventh embodiment. Description thereof will thus be omitted here.

Another planar circuit 5b, or a feed circuit of the bottom patch antenna 72b, is located on the bottom 4 of the package 1. The planar circuit 5b has a signal outlet part 53 on its package-bottom side.

A dielectric sheet 112 is formed on the outside of the metal wall that constitutes the bottom 4 of the package 1. A circular patch antenna 72b made of a metal film is arranged on the surface of this dielectric sheet 112 (shown to the bottom in FIG. 15).

A small hole 62 is formed in the dielectric sheet 112 and the metal wall of the bottom 4 behind the patch antenna 72b. Through this small hole 62, the signal outlet part 53 of the other planar circuit 5b and the backside of the patch antenna 72b are connected with a signal line 54.

The patch antenna 72b arranged on the package bottom 4 is thus fed by the signal line 54 with the outside surface of the package bottom 4 as the antenna ground plane. Here, the planar circuit 5b located inside the package bottom 4 and the patch antenna 72b located outside the bottom 4 can be connected with the signal line 54, or short feed line, for easy matching.

Having the foregoing configuration, the package 1 of the eighth embodiment allows the patch antennas 72 and 72b to be arranged on the surface of the lid 2 of the package 1 and that of the bottom 4 opposite from the lid 2, respectively, for the sake of front and rear antenna arrangement on the package.

Figure 16:
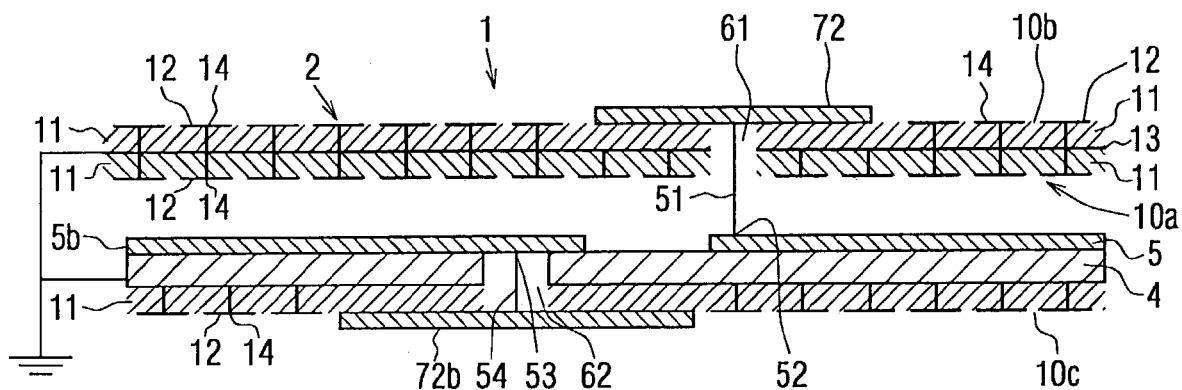
FIG. 16 is a diagram showing a partial cross-sectional view of another example of the package according to the eighth embodiment.

In another example of the eighth embodiment, as shown in FIG. 16, HIPs 10b and 10c may also be formed on the surface of the outermost dielectric sheet 11 of the lid 2 and that of the outermost dielectric sheet 11 of the bottom 4, respectively, as in the example (FIG. 14) of the foregoing seventh embodiment. The HIPs 10 and 10c have band gaps that cover the resonant frequencies of the respective patch antennas 72 and 72b. As a result, both the patch antennas 72 and 72b arranged on the front (lid) and rear (bottom) of the package can be prevented from rear radiation, thereby avoiding deterioration of the antenna characteristics.

(Ninth Embodiment)

Figure 17:
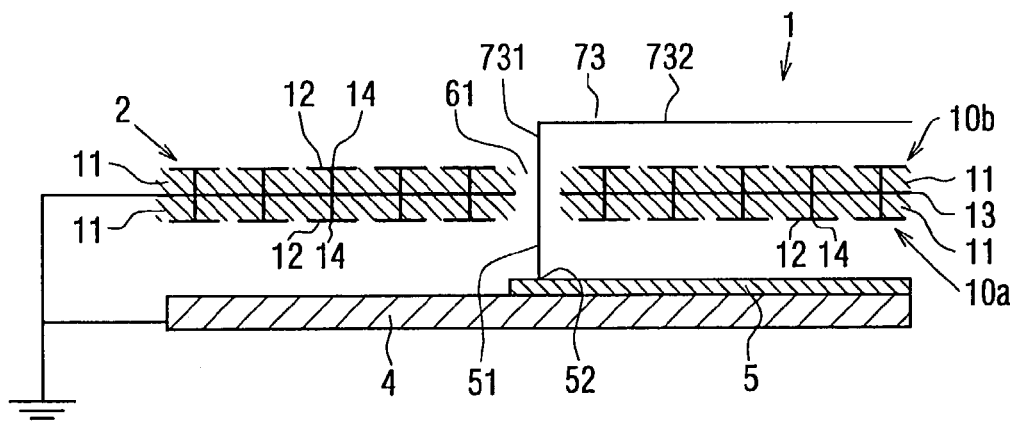
FIG. 17 is a diagram showing a partial cross-sectional view of the package according to a ninth embodiment of the present invention.

The package 1 according to a ninth embodiment of the present invention differs from the foregoing sixth embodiment in that an inverted L antenna 73 is formed as the element antenna instead of the monopole antenna, and an HIP is used as the antenna ground plane. FIG. 17 shows part of a cross section of the package 1 according to the ninth embodiment. The package bottom 4 and the planar circuit 5 located on the bottom 4 are the same as in the sixth embodiment. Description thereof will thus be omitted here.

The lid 2 of the package 1 has HIPS 10a and 10b having the same band gap, with the inside and outside surfaces thereof as the respective HIP formation surfaces. That is, the HIPS 10a and 10b on both sides are formed on a single metal plate which serves as a common backside conductor sheet 13. Identical dielectric sheets 11 and metal patches 12 are arranged for the same electric characteristics. As in the sixth embodiment, the lid 2 has a hole 61 corresponding to a single metal patch 12 of the HIPS 10a and 10b.

The inverted L antenna 73, the element antenna, is composed of a vertical conductor part 731 and a horizontal conductor part 732. The vertical conductor part 731 is connected with the signal line 51 which is led from the signal outlet part 52 of the planar circuit 5, and extends vertically to the exterior of the lid 2 through the hole 61 of the lid 2. The horizontal conductor part 732 bends at 90° from the vertical conductor part 731 to extend parallel with the lid 2. This inverted L antenna 73 is configured to have a resonant frequency that falls within the band gap of the HIP 10b formed on the lid 2.

As a result, the HIP 10b formed on the lid passes no surface current at the resonant frequency of the inverted L antenna 73. That is, any image current that can cancel the current in the horizontal conductor part 732 of the inverted L antenna 73 is prevented for sufficient antenna resonance.

In the foregoing configuration, the inverted L antenna 73 is arranged directly on the outside surface of the lid 2 of the package 1 having the HIPs 10a and 10b formed both inside and outside, and this inverted L antenna 73 is directly fed by the planar circuit 5 in the package by using the signal line 51 through the hole 61 which is formed in the HIPs 10a and 10b. The package 1 of the ninth embodiment can thus reduce the length of the feed line leading to the inverted L antenna 73. Consequently, impedance matching between the antenna and the planar circuit is facilitated, and the antenna can be arranged on the lid 2 of the package 1 with increased flexibility.

Since the antenna ground plane uses the HIP 10 having a band gap that covers the resonant frequency of the inverted L antenna 73, it is possible to obtain sufficient resonance in an inverted L antenna. Since it is sized similar to a metal patch 12 of the HIPs 10a and 10b, the hole 61 for signal outlet can be easily formed in the lid 2 of the package 1. Additionally, due to the small size of the hole itself, the shielding performance of the package 1 will not be deteriorated.

(Tenth Embodiment)

The package according to a tenth embodiment of the present invention is the package 1 of the foregoing first embodiment having an intermediate metal plate 8 for arranging a second planar circuit 5e in parallel with the bottom 4 and a planar circuit 5d on the bottom 4.

Figure 18:
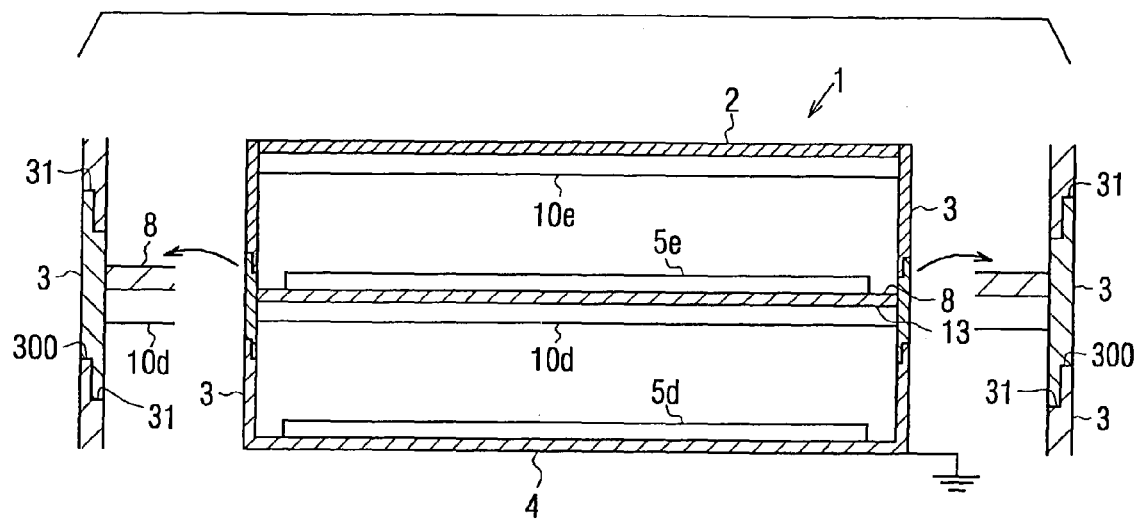
FIG. 18 is a diagram showing a partial cross-sectional view of the package according to a tenth embodiment of the present invention.

FIG. 18 is a cross-sectional view of the package 1 of the tenth embodiment. In the diagram, the HIPs are shown simplified as layers of predetermined thickness. The lid 2 and the bottom 4 of the package 1 are configured the same as in the foregoing first embodiment. Description thereof will thus be omitted here. In the tenth embodiment, the planar circuit placed on the bottom 4 will be referred to as a first planar circuit 5d, the planar circuit placed on the top face of the intermediate metal plate 8, to be described later, a second planar circuit 5e, the HIP arranged on the bottom face of the intermediate metal plate 8, a first HIP 10d, and the HIP arranged on the inside surface of the lid 2, a second HIP 10e.

The package 1 has the intermediate metal plate 8 almost at the center in the height direction thereof, parallel with the lid 2 and the bottom 4. This intermediate metal plate 8 is electrically connected with the sidewalls 3 of the package 1 for a ground potential.

The upper surface of the intermediate metal plate 8 in the diagram (referred to as the top face) is provided with the second planar circuit 5e. The ground pattern of the second planar circuit 5e and the intermediate metal plate 8 are electrically connected with each other. The second planar circuit 5e is located with such a slight gap to preclude contact with the second HIP 10e which is formed on the inside surface of the lid 2. The operating frequency of the second planar circuit 5e falls within the band gap of the second HIP 10e. In FIG. 18, the gaps in the height direction of the package 1 are shown emphasized with respect to the dimensions in the horizontal direction.

The bottom face of the intermediate metal plate 8, opposite from the top face, is an HIP formation surface on which the first HIP 10d having a band gap that covers the operating frequency of the first planar circuit 5d is formed. The conductor sheet 13 constituting the backside of the first HIP 10d is bonded onto the bottom face of the intermediate metal plate 8 with an electric connection.

Having the foregoing configuration, the package 1 of the tenth embodiment provides a package in which a plurality of planar circuits 5d and 5e can be stacked in layers with high isolation capacities between the planar circuits. Incidentally, the sidewalls 3 of the package 1 can be configured in a separable fashion as a top and bottom near the intermediate metal plate 8 to facilitate fabricating the package 1 and the package circuits 5. Moreover, as shown in FIG. 18, the intermediate metal plate 8 and a sidewall frame 3 for supporting the intermediate metal plate 8 may be configured as a single unit to form a coupler 300 which has steps 31 formed on the sidewall part 3. Then, such couplers 300 can be stacked on each other to easily fabricate a package 1 having multilayer boards.

(Other Embodiments)

Various modifications may be made to the foregoing embodiments as follows:

(1) Components of the packages of the foregoing embodiments, namely, a lid having an HIP (the first embodiment), a partition having HIPs, anti-warpage slits formed in the backside conductor sheet of an HIP (the second embodiment), a connector arranged on an external wall having an HIP (the third embodiment), an external planar circuit arranged on an external wall (the fourth embodiment), and a variety of element antennas (the sixth to ninth embodiments) may be used in combination as appropriate.

Besides, combinations of these components may also be applied to a multilayer circuit package (the tenth embodiment).

Figure 19:
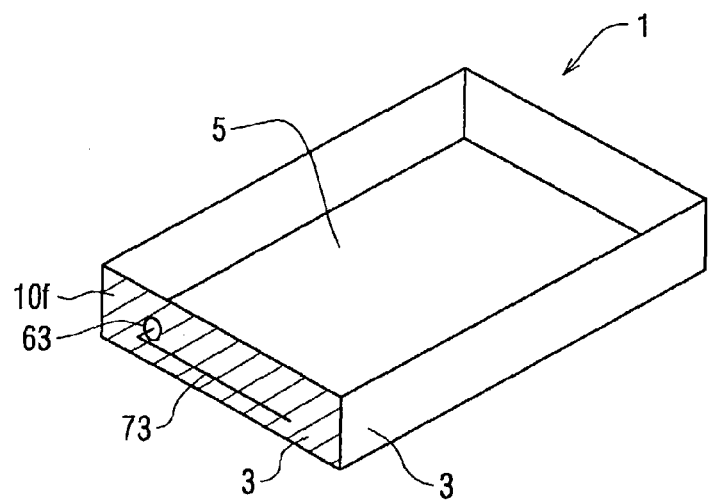
FIG. 19 is a perspective view of the package according to another embodiment of the present invention.

(2) In the foregoing ninth embodiment, the inverted L antenna 73 is arranged on the lid 2 of the package 1. The inverted L antenna 73 is not limited thereto, but may be arranged on a sidewall 3 of the package 1 as shown in FIG. 19. FIG. 19 is a perspective view of the package 1 without the HIP-formed lid 2.

In this case, the sidewall 3 for the inverted L antenna 73 to be arranged on has a hole 63 for signal outlet. Through this hole 63, the inverted L antenna is fed by the planar circuit 5 inside the package 1 by using a signal line. An HIP 10f having a band gap that covers the resonant frequency of the inverted L antenna 73 is formed on the surface of the sidewall 3 immediately under the inverted L antenna, allowing sufficient resonance of the inverted L antenna.

(3) The foregoing embodiments have dealt with the cases where the HIP 10 formed on the inside or outside surface of the package 1 has a two-dimensional array of regular hexagonal metal patches 12 as shown in FIG. 2A or 2B. However, this is not restrictive. For example, a two-dimensional periodic array of square metal patches is also applicable.

(4) The foregoing embodiments have dealt with the cases where the surface for the HIP 10 facing the planar circuit 5 in the package 1 to be formed on is configured as the lid 2 of the package 1. However, this is not restrictive. The HIP formation surface and the package sidewalls 3 perpendicular to the planar circuit may be configured as a detachable lid. Moreover, the surface on which the planar circuit 5 is formed (the surface that constitutes the package bottom 4 in the foregoing embodiments) may be exclusively rendered detachable from the package 1 as a lid.

(5) The foregoing embodiments have dealt with the cases where the package 1 is shaped like a rectangular solid (hexahedron). However, this is not restrictive. The package 1 may be polyhedrons including an octahedron, a decahedron, and a tetrahedron, or shaped with curved surfaces in terms of a beautiful appearance. It is essential only that the package 1 accommodates a circuit board and a photonic band gap material, or an HIP as a form of the same, in parallel with the circuit board.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A package for accommodating a radio frequency circuit, the package comprising:
   a photonic band gap material formed in two dimensions on a formation surface with at least a part of a surface of a formation wall inside said package acting as said formation surface; wherein
   said formation wall is at least a part of a plurality of walls constituting the package;
   said photonic band gap material has a band gap for blocking a surface current in a predetermined frequency band;
   said radio frequency circuit has an operating frequency falling within the frequency band of said band gap;
   said formation wall is made of a metal plate;
   said photonic band gap material is formed on said formation surface of said metal plate; and
   said photonic band gap material formed on said formation surface is made of a high impedance plate including:
   a dielectric sheet of predetermined thickness,
   a conductor sheet formed on a backside of said dielectric sheet,
   a plurality of identically-shaped metal patches arranged in two dimensions on a surface of said dielectric sheet with their ends at equal intervals from each other, and
   a plurality of connecting members for electrically connecting said conductor sheet and said metal plate, wherein
   said metal patches lying on a surface of said high impedance plate face said radio frequency circuit.

2. The package according to claim 1, wherein a surface of said formation wall lying on an outside of the package is made of said conductor sheet of said high impedance plate.

3. The package according to claim 1, wherein
   said formation wall is made of a metal plate, and
   said conductor sheet of said high impedance plate is electrically bonded onto said formation surface of said metal plate.

4. The package according to claim 1, wherein said connecting members are through holes.

5. The package according to claim 1, wherein said conductor sheet defines a plurality of anti-warpage slits.

6. The package according to claim 1, wherein said formation surface is perpendicular to an electric-field vector occurring in the package.

7. The package according to claim 1, wherein
said radio frequency circuit is a planar circuit having a circuit element arranged on a planar ground pattern, and
said ground pattern is located in parallel with said formation surface.

8. The package according to claim 1, wherein
a detachable lid is formed in a part of said walls constituting the package, and
said lid serves as said formation wall, and a surface of said lid facing said radio frequency circuit serves as said formation surface.

9. The package according to claim 8, wherein a part of said walls constituting the package other than said lid is said formation wall.

10. The package according to claim 9, comprising a partition for sectioning an internal space of the package, said partition serving as said formation wall.

11. The package according to claim 10, wherein
said partition is made of a metal plate; and
both sides of said metal plate serve as said formation wall.

12. The package according to claim 1, wherein
a connector for electrical connection is formed on the surface of said formation wall opposite said formation surface; and
said connector and said radio frequency circuit are connected with a signal line.

13. The package according to claim 1, further comprising:
a second radio frequency circuit arranged on the surface of said formation wall opposite from said formation surface, wherein
said radio frequency circuit accommodated in the package and said second radio frequency circuit are connected with a signal line through said formation wall.

14. The package according to claim 1, further comprising:
an element antenna on the surface of said formation wall opposite from said formation surface, wherein
said radio frequency circuit accommodated in the package and said element antenna are connected through said formation wall with a signal line.

15. The package according to claim 4, wherein
the surface of said formation wall opposite from said formation surface is made of a metal plate, and
said element antenna is one of a monopole antenna and a patch antenna.

16. The package according to claim 14, wherein
said formation surface is formed on both sides of said formation wall, and
said element antenna is a patch antenna or an inverted L antenna having a resonant frequency falling within the band gap of the photonic band gap material formed on said formation surfaces.

17. A package for accommodating a radio frequency circuit, the package comprising:
a photonic band gap material formed in two dimensions on a formation surface with at least a part of a surface of a formation wall inside said package acting as said formation surface; wherein
said formation wall is at least a part of a plurality of walls constituting the package;
said photonic band gap material has a band gap for blocking a surface current in a predetermined frequency band;
said radio frequency circuit has an operating frequency falling within the frequency band of said band gap;
said radio frequency circuit includes a plurality of blocks for operating at respective different frequencies; and
a plurality of photonic band gap materials having band gaps covering the corresponding operating frequencies are formed on said formation surface as opposed to said blocks, respectively.

18. The package according to claim 17, wherein when said formation surface includes an opposed part opposed to a transmission line a part of said radio frequency circuit including said circuit element and a non-opposed part other than said opposed part, said non-opposed part is provided with photonic band gap material configured to have a band gap whose frequency band covers an unwanted frequency component different from the operating frequency of said radio frequency circuit.

* * * * *